US012775192B2

(12) United States Patent
Son et al.

(10) Patent No.: US 12,775,192 B2
(45) Date of Patent: Oct. 27, 2026

(54) LIGHT PATH CONTROL MEMBER AND DISPLAY DEVICE COMPRISING SAME

(71) Applicant: LG INNOTEK CO., LTD., Seoul (KR)

(72) Inventors: Mun Yeong Son, Seoul (KR); Jin Gyeong Park, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 115 days.

(21) Appl. No.: 18/859,438

(22) PCT Filed: Mar. 15, 2023

(86) PCT No.: PCT/KR2023/003467
§ 371 (c)(1),
(2) Date: Oct. 23, 2024

(87) PCT Pub. No.: WO2023/210965
PCT Pub. Date: Nov. 2, 2023

(65) Prior Publication Data
US 2025/0271723 A1 Aug. 28, 2025

(30) Foreign Application Priority Data
Apr. 27, 2022 (KR) ........................ 10-2022-0052140

(51) Int. Cl.
*G02F 1/1676* (2019.01)
*G02F 1/1335* (2006.01)
(Continued)

(52) U.S. Cl.
CPC ...... *G02F 1/1676* (2019.01); *G02F 1/133601* (2021.01); *G02F 1/167* (2013.01); *G02F 1/1677* (2019.01); *H10K 59/50* (2023.02)

(58) Field of Classification Search
CPC ...... G02F 1/1676; G02F 1/1677; G02F 1/167; G02F 1/133601
(Continued)

(56) References Cited

U.S. PATENT DOCUMENTS 11,309,526 B2 4/2022 Lim et al.
2011/0285942 A1 11/2011 Guo et al.
(Continued)

FOREIGN PATENT DOCUMENTS

KR 10-2014-0085466 A 7/2014
KR 10-2016-0108716 A 9/2016
(Continued)

OTHER PUBLICATIONS

International Search Report dated Jun. 19, 2023 in International Application No. PCT/KR2023/003467.
(Continued)

*Primary Examiner* — James R Greece
(74) *Attorney, Agent, or Firm* — SALIWANCHIK, LLOYD & EISENSCHENK

(57) ABSTRACT

An light path control member according to an embodiment includes a first substrate; a first electrode disposed on the first substrate; a second substrate disposed on the first substrate; a second electrode disposed under the second substrate; a light conversion unit disposed between the first electrode and the second electrode and including a receiving part receiving a light conversion material; and a buffer layer disposed between the first substrate and the light conversion unit, and wherein the first electrode and the second electrode include different materials.

20 Claims, 13 Drawing Sheets

(51) Int. Cl.

| | |
|---|---|
| ***G02F 1/167*** | (2019.01) |
| ***G02F 1/1677*** | (2019.01) |
| *H10K 59/50* | (2023.01) |

(58) Field of Classification Search
USPC .......................................................... 359/296
See application file for complete search history.

(56) References Cited

U.S. PATENT DOCUMENTS

| | | | | |
|---|---|---|---|---|
| 2014/0232960 | A1 | 8/2014 | Schwartz et al. | |
| 2023/0077281 | A1 | 3/2023 | Han et al. | |
| 2025/0133943 | A1* | 4/2025 | Lee .................... | H10K 59/8792 |

FOREIGN PATENT DOCUMENTS

| | | | |
|---|---|---|---|
| KR | 10-2019-0048927 | A | 5/2019 |
| KR | 10-2020-0035774 | A | 4/2020 |
| KR | 10-2020-0042752 | A | 4/2020 |
| KR | 10-2021-0091549 | A | 7/2021 |
| KR | 10-2022-0014129 | A | 2/2022 |
| KR | 10-2022-0032758 | A | 3/2022 |

OTHER PUBLICATIONS

Office Action dated May 14, 2026 in Korean Application No. 10-2022-0052140.

* cited by examiner (a)

(b)

privacy mode

LIGHT PATH CONTROL MEMBER AND DISPLAY DEVICE COMPRISING SAME

CROSS-REFERENCE TO RELATED APPLICATIONS

This application is the U.S. national stage application of International Patent Application No. PCT/KR2023/003467, filed Mar. 15, 2023, which claims the benefit under 35 U.S.C. § 119 of Korean Application No. 10-2022-0052140, filed Apr. 27, 2022, the disclosures of each of which are incorporated herein by reference in their entirety.

TECHNICAL FIELD

An embodiment relates to a light path control member and a display device comprising the same.

BACKGROUND ART

A light path control member controls a movement of light from the light source and is attached to a front surface of a display panel which is a display device used for a mobile phone, a notebook, a tablet PC, a vehicle navigation device, a vehicle touch, etc., so that the light path control member adjusts a viewing angle of light according to an incident angle of light to express a clear image quality at a viewing angle needed by a user when the display transmits a screen.

In addition, the light path control member can be used inside or outside of a vehicle, on a window of a building, etc. to partially to inhibit glare, or to inhibit the inside from being visible from the outside.

That is, the light path control member controls a path of light movement, so that light in a specific direction can be blocked and light in a specific direction can be transmitted. Accordingly, the light path control member can control a transmission angle of light, so that the user's viewing angle can be controlled.

Meanwhile, the light path control member can be divided into a light path control member that can always control a viewing angle regardless of the surrounding environment or the user's environment, and a switchable light path control member that can turn the viewing angle control function on or off by the user depending on the surrounding environment or the user's environment.

This light path control member can be implemented by filling an inside of a pattern part with particles that can move according to the application of voltage and a dispersion liquid that disperses the particles, and changing the pattern part to a light transmitting part and a light blocking part by dispersion and aggregation of the particles.

For example, a negative voltage is applied to one electrode. In addition, a positive voltage is applied to the other electrode. As a result, negatively charged particles move toward an electrode to which the positive voltage is applied.

At this time, when a negative voltage is applied to the electrode, cations diffuse to a surface of the electrode. In addition, cations (positive ions) can react with a metal component of the electrode. As a result, a yellowing phenomenon in which a color of the electrode changes may occur.

The yellowing phenomenon is recognized as a stain from an outside. As a result, the user's visibility is reduced.

Therefore, a new structure of a light path control member that can solve the above problem is required.

Meanwhile, a technology related to the light path control member is disclosed in Korean Publication No. KR10-2022-0032758.

DISCLOSURE

Technical Problem

The embodiment provides a light path control member having improved reliability, visibility and light transmittance.

Technical Solution

An light path control member according to an embodiment includes a first substrate; a first electrode disposed on the first substrate; a second substrate disposed on the first substrate; a second electrode disposed under the second substrate; a light conversion unit disposed between the first electrode and the second electrode and including a receiving part receiving a light conversion material; and a buffer layer disposed between the first substrate and the light conversion unit, and wherein the first electrode and the second electrode include different materials.

Advantageous Effects

The light path control member according to the embodiment inhibits a yellowing phenomenon. Specifically, a reaction between anions (negative ions) generated by an application of voltage and the first electrode is minimized. As a result, the yellowing phenomenon of the first electrode is inhibited.

Therefore, the light path control member according to the embodiment has improved reliability and visibility.

In addition, the light path control member according to the embodiment includes a buffer layer. As a result, the path of light passing through the light path control member is controlled to be closer to a front direction.

Accordingly, light leaking in a lateral direction of the light path control member is reduced. Therefore, even if the first electrode is formed of an opaque metal, the light path control member has improved light transmittance.

MODES OF THE INVENTION

Hereinafter, embodiments of the present invention will be described in detail with reference to the accompanying drawings. However, the spirit and scope of the present invention is not limited to a part of the embodiments described, and may be implemented in various other forms, and within the spirit and scope of the present invention, one or more of the elements of the embodiments may be selectively combined and replaced.

In addition, unless expressly otherwise defined and described, the terms used in the embodiments of the present invention (including technical and scientific terms) may be construed the same meaning as commonly understood by one of ordinary skill in the art to which this invention belongs, and the terms such as those defined in commonly used dictionaries may be interpreted as having a meaning that is consistent with their meaning in the context of the relevant art.

In addition, the terms used in the embodiments of the present invention are for describing the embodiments and are not intended to limit the present invention. In this specification, the singular forms may also include the plural forms unless specifically stated in the phrase, and may include at least one of all combinations that may be combined in A, B, and C when described in "at least one (or more) of A (and), B, and C".

Further, in describing the elements of the embodiments of the present invention, the terms such as first, second, A, B, (a), and (b) may be used. These terms are only used to distinguish the elements from other elements, and the terms are not limited to the essence, order, or order of the elements.

In addition, when an element is described as being "connected", or "coupled" to another element, it may include not only when the element is directly "connected" to, or "coupled" to other elements, but also when the element is "connected", or "coupled" by another element between the element and other elements.

Further, when described as being formed or disposed "on (over)" or "under (below)" of each element, the "on (over)" or "under (below)" may include not only when two elements are directly connected to each other, but also when one or more other elements are formed or disposed between two elements.

Furthermore, when expressed as "on (over)" or "under (below)", it may include not only the upper direction but also the lower direction based on one element.

Hereinafter, an light path control member according to an embodiment will be described with reference to the drawings.

Figure 1:
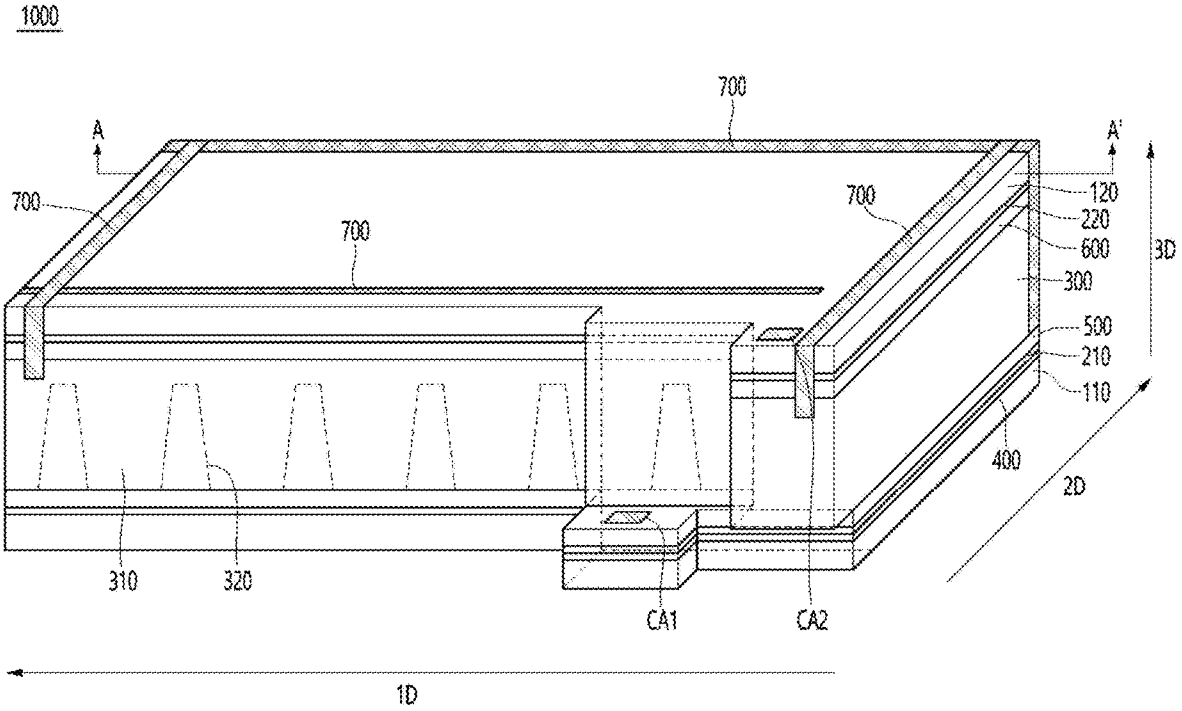
FIG. 1 is a perspective view of a light path control member according to an embodiment.
Figure 2:
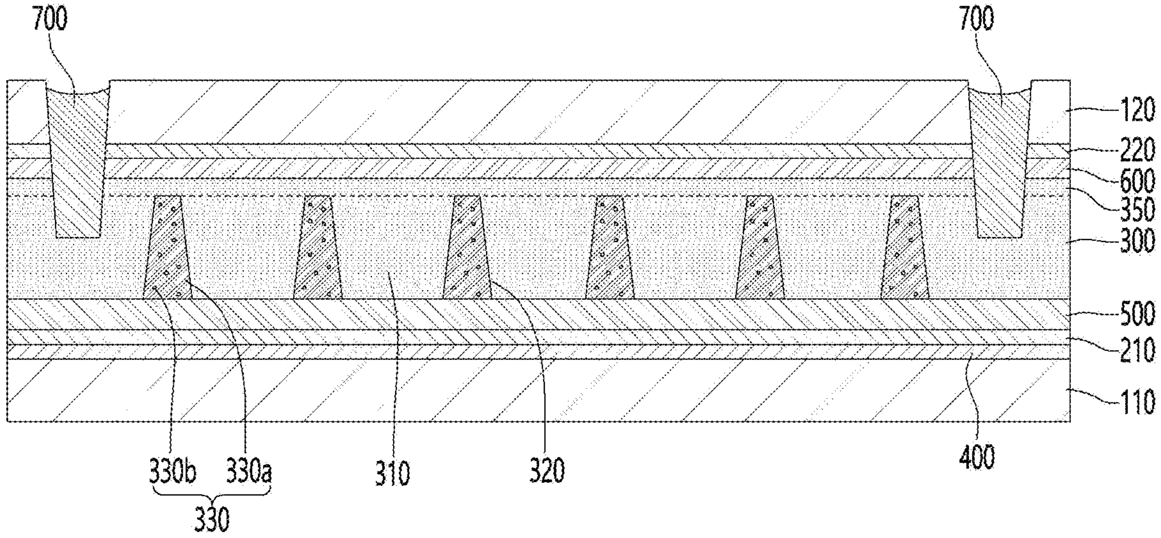
FIG. 2 and FIG. 3 are cross-sectional views taken along a A-A' region of FIG. 1.
Figure 3:
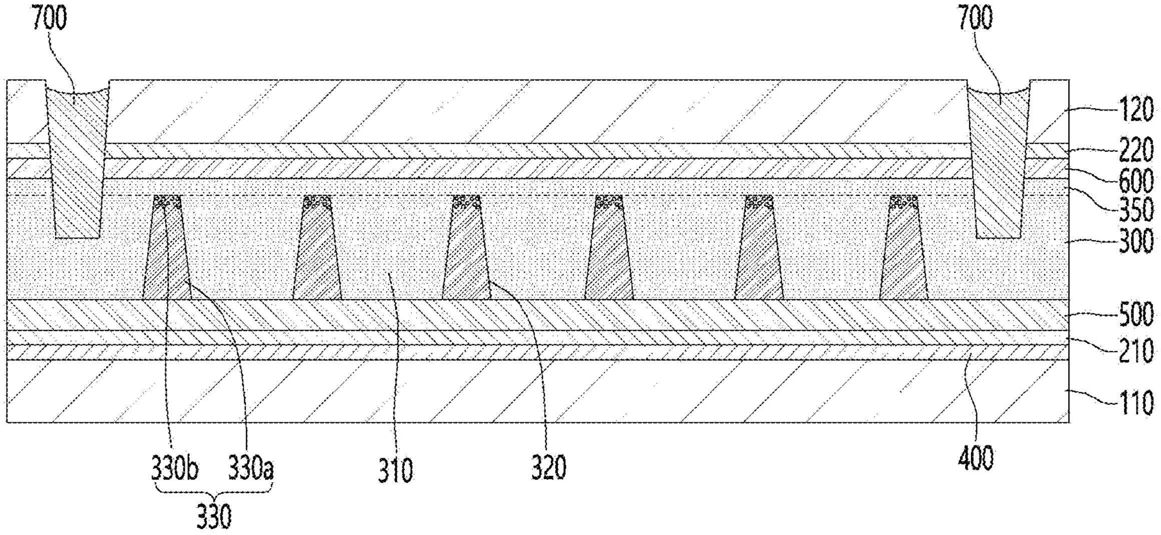

Referring to FIGS. 1 to 3, the light path control member 1000 includes a first substrate 110, a second substrate 120, a first electrode 210, a second electrode 220, and a light conversion unit 300. In addition, the light path control member 1000 may further include at least one of an adhesive layer, a primer layer, a buffer layer, and a sealing part.

The first substrate 110 supports the first electrode 210. The first substrate 110 may be rigid or flexible.

In addition, the first substrate 110 may be transparent. For example, the first substrate 110 may include a transparent substrate capable of transmitting light.

The first substrate 110 may include glass, plastic, or a flexible polymer film. For example, the flexible polymer film may be made of any one of polyethylene terephthalate (PET), polycarbonate (PC), acrylonitrile-butadiene-styrene copolymer (ABS), polymethyl methacrylate (PMMA), polyethylene naphthalate (PEN), polyether sulfone (PES), cyclic olefin copolymer (COC), triacetylcellulose (TAC) film, polyvinyl alcohol (PVA) film, polyimide (PI) film, and polystyrene (PS), which is only an example, but the embodiment is not limited thereto.

In addition, the first substrate 110 may be a flexible substrate having flexible characteristics.

In addition, the first substrate 110 may be a curved or bent substrate. That is, the light path control member including the first substrate 110 may also be formed to have flexible, curved or bent characteristics. Accordingly, the light path control member may be changed into various designs.

The first substrate 110 extends in a first direction 1D, a second direction 2D and a third direction 3D.

In detail, the first direction 1D corresponds to a length or width direction of the first substrate 110. The second direction 2D extends in a direction different from the first direction 1D. In addition, the second direction 2D corresponds to a length or width direction of the first substrate 110. The third direction 3D extends in a direction different from the first direction 1D and the second direction 2D. In addition, the third direction 3D corresponds to a thickness direction of the first substrate 110.

Hereinafter, the first direction 1D is defined as the length direction of the first substrate 110. In addition, the second direction 2D is defined as the width direction of the first substrate 110. In addition, the third direction 3D is defined as the thickness direction of the first substrate 110.

The first substrate 110 has a thickness within a set range. For example, the thickness of the first substrate 110 may be 25 μm to 150 μm. In more detail, the thickness of the first substrate 110 may be 30 μm to 100 μm. In more detail, the thickness of the first substrate 110 may be 35 μm to 75 μm. In more detail, the thickness of the first substrate 110 may be 40 μm to 60 μm.

The first electrode 210 is disposed on the first substrate 110. In detail, the first electrode 210 is disposed between the first substrate 110 and the light conversion unit 300. A buffer layer 400 is disposed between the first substrate 110 and the first electrode 210. A difference in refractive index of a region between the first substrate 110 and the first electrode 210 is reduced by the buffer layer 400. The buffer layer 400 will be described in detail below.

The first electrode 210 includes a conductive material. The first electrode 210 may be defined as an electrode to which a negative voltage is applied when the light path control member is driven in a publication mode.

The first electrode 210 includes a material having different characteristics from the second electrode 220 described below. The materials of the first electrode 210 and the second electrode 220 will be described in detail below.

The second substrate 120 is disposed on the first substrate 110. In detail, the second substrate 120 is disposed on the first electrode 210 on the first substrate 110.

The second substrate 120 may include a material identical to or similar to the first substrate 110 described above.

In addition, the second substrate 120 may have a thickness identical to or different from the first substrate 110 described above. For example, the first substrate 110 and the second substrate 120 may have the same or different thicknesses in a thickness range of 25 μm to 150 μm.

In addition, the second substrate 120 extends in the first direction 1D, the second direction 2D, and the third direction 3D to correspond to the first substrate 110 described above. Hereinafter, the first direction 1D is defined as a length direction of the second substrate 120 for convenience of explanation. In addition, the second direction 2D is defined as a width direction of the second substrate 120. In addition, the third direction 3D is defined as a thickness direction of the second substrate 120.

A first connection region CA1 is disposed on the first substrate 110. A second connection region CA2 is disposed on the second substrate 120.

A conductive material is exposed on an upper surface of the first connection region CA1. A conductive material is exposed on an upper surface of the second connection region CA2. For example, a first electrode 210 is exposed in the first connection region CA1. In addition, a conductive material is exposed in the second connection region CA2. That is, a cutting region for filling a conductive material is formed in the second substrate 120. A conductive material is filled inside the cutting region. As a result, the second connection region is formed.

The light path control member is electrically connected to an external (flexible) printed circuit substrate by the first connection region CA1 and the second connection region.

The second electrode 220 is disposed on one surface of the second substrate 120. In detail, the second electrode 220 is disposed on a lower surface of the second substrate 120. That is, the second electrode 220 is disposed on a surface of the second substrate where the second substrate 120 and the first substrate 110 face each other. That is, the second electrode 220 faces the first electrode 210 on the first substrate 110. That is, the second electrode 220 is disposed between the first electrode 210 and the second substrate 120.

The second electrode 220 includes a conductive material. The second electrode 220 is defined as an electrode to which a positive voltage is applied when the light path control member is driven in a publication mode.

The light conversion unit 300 is disposed between the first substrate 110 and the second substrate 120. In detail, the light conversion unit 300 is disposed between the first electrode 210 and the second electrode 220.

An adhesive layer 500 is disposed between the first electrode 210 and the light conversion unit 300. As a result, the first substrate 110 and the light conversion unit 300 are adhered.

The adhesive layer 500 has a thickness within a set range. For example, a thickness of the adhesive layer 500 may be 10 μm to 30 μm. In detail, the thickness of the adhesive layer 500 may be 15 μm to 25 um.

In addition, a primer layer 600 is disposed between the second electrode 220 and the light conversion unit 300. As a result, the adhesion between the second electrode 220 and the light conversion unit 300, which contain different materials, is improved.

The primer layer 600 has a thickness within a set range. For example, a thickness of the primer layer 600 may be less than 1 μm.

The first substrate 110, the second substrate 120, and the light conversion unit 300 are adhered by the adhesive layer 500 and the primer layer 600.

The light conversion unit 300 includes a plurality of partition walls 310 and a receiving part 320. Alight conversion material 330 is disposed in the receiving part 320. The light conversion material 330 includes light conversion particles and a dispersion liquid. The light conversion particles moves depending on whether voltage is applied. In addition, the dispersion liquid disperses the light conversion particles. The light transmission characteristics of the light path control member 1000 are changed by the light conversion particles. That is, the light transmittance of the light path control member 1000 is changed by a movement of the light conversion particles.

FIG. 2 and FIG. 3 are cross-sectional views taken along line A-A' of FIG. 1.

Referring to FIG. 2 and FIG. 3, the light conversion unit 300 includes a partition wall part 310 and a receiving part 320.

The partition wall part 310 is defined as a partition wall region that separates a plurality of receiving parts. The partition wall part 310 transmits light. Therefore, light moving from the first substrate 110 toward the second substrate 120 or light moving from the second substrate 120 toward the first substrate 110 is transmitted through the partition wall part 310.

The partition wall part 310 and the receiving part 320 are disposed with different widths. For example, a width of the partition wall part 310 may be larger than a width of the receiving part 320.

In addition, the receiving part 320 may be formed in a shape in which a width narrows while extending from the first electrode 210 toward the second electrode 220.

The partition wall part 310 and the receiving part 320 may be alternately disposed. That is, each partition wall part 310 is disposed between adjacent receiving parts 320. In addition, each receiving part 320 is disposed between adjacent partition wall parts 310.

The partition wall part 310 may include a transparent material. The partition wall part 310 may include a material capable of transmitting light.

The partition wall part 310 may include a resin material. For example, the partition wall part 310 may include a photocurable resin material. For example, the partition wall part 310 may include a UV resin or a transparent photoresist resin. Alternatively, the partition wall part 310 may include an urethane resin or an acrylic resin, etc.

The receiving part 320 is formed by partially penetrating the light conversion unit 300. Accordingly, the receiving part 320 comes into contact with the adhesive layer 500. In addition, the receiving part 320 is spaced apart from the primer layer 600. Accordingly, a base part 350 is disposed between the receiving part 320 and the primer layer 600.

The receiving part 320 is tilted in one direction. For example, the receiving part 320 is tilted at a set angle with respect to the first direction 1D or the second direction 2D. Accordingly, when the light path control member and the display panel are combined, a moire phenomenon caused by overlapping the receiving part 320 and a pixel pattern of the display panel is reduced. Thereby, the user's visibility is improved.

The light conversion material 330 is sealed inside the receiving part 320. For example, the light conversion material 300 is disposed inside the receiving part 320. In addition, one end and the other end of the receiving part 320 are sealed by a sealing part 700.

The light conversion material 330 is disposed in the receiving part 320. The light conversion material 330 includes light conversion particles 330*b* and a dispersion liquid 330*a*.

The dispersion liquid 330*a* is a material dispersing the light conversion particles 330*b*. The dispersion liquid 330*a* may include a transparent material. The dispersion liquid 330*a* may include a nonpolar solvent. In addition, the dispersion liquid 330*a* may include a material capable of transmitting light. For example, the dispersion liquid 330*a* may include at least one of a halocarbon oil, a paraffin oil, and isopropyl alcohol.

The light conversion particle 330*b* is dispersed inside the dispersion liquid 330*a*.

The light conversion particle 330*b* may include a material capable of absorbing light. That is, the light conversion particle 330*b* is a light absorbing particle. The light conversion particle 330*b* may have a color. For example, the light conversion particle 330*b* may have a black color. As an example, the light conversion particle 330*b* may include a carbon black particle.

A surface of the light conversion particle 330*b* may be charged. Accordingly, the light conversion particle 330*b* may have polarity. For example, a surface of the light conversion particle 330*b* may be charged with a negative charge. Accordingly, when voltage is applied to the light path control member, the light conversion particle 330*b* inside the receiving part 320 moves.

The light transmittance of the receiving part 320 changes by the light conversion particle 330*b*. In detail, the light transmittance of the receiving part 320 changes by the light conversion particle 330*b* and the receiving part 320 can be converted into a light blocking part and a light transmitting part. That is, the transmittance of light passing through the receiving part 320 changes by dispersion or aggregation of the light conversion particle 330*b*.

For example, when the light path member is in an off state, voltage is applied to the second electrode 200 and the partition wall part 310. As a result, the light path control member is converted from a first mode to a second mode. Alternatively, the light path control member is converted from the second mode to the first mode.

In detail, the receiving part 320 becomes a light blocking part in the first mode. Thereby, the receiving part 320 blocks light having a set range of angles. Thereby, a viewing angle of the user looking from the outside is narrowed. Therefore, the first mode may be a privacy mode.

In addition, the receiving part 320 becomes a light transmitting part in the second mode. Accordingly, the receiving part 320 transmits light. Thereby, the light path control member transmits light from both the partition wall part 310 and the receiving part 320. Thereby, an viewing angle of the user looking from the outside is widened. Therefore, the second mode may be a publication mode.

The switching from the first mode to the second mode may be implemented by a movement of the light conversion particle 330*b*. The surface of the light conversion particle 330*b* has a charge. The light conversion particle 330*b* may move in a direction of the second electrode to which a positive voltage is applied according to the characteristics of the charge.

For example, when no voltage is applied from the outside, the light conversion particle 330*b* is uniformly dispersed in the dispersion liquid 330*a*. Accordingly, the light of the receiving part 320 is blocked by the light conversion particle 330*b*. Accordingly, the receiving part 320 is driven as a light blocking part in the first mode.

In addition, when a voltage is applied from the outside, the light conversion particle 330*b* moves. For example, the light conversion particle 330*b* moves toward one end or the other end of the receiving part 320. That is, the light conversion particle 330*b* moves toward the second electrode 220 to which a positive voltage is applied.

For example, when voltage is applied to the first electrode 210 and/or the second electrode 220, an electric field is formed between the first electrode 210 and the second electrode 220. In addition, the light conversion particles 330*b* that are negatively charged can move toward the second electrode 220 using the dispersion liquid 330*a* as a medium.

For example, in an initial mode or when no voltage is applied to the first electrode 210 and/or the second electrode 220, as illustrated in FIG. 2, the light conversion particles 330*b* are uniformly dispersed within the dispersion liquid 330*a*. Therefore, the receiving part 320 is driven as a light blocking part.

In addition, when voltage is applied to the first electrode 210 and/or the second electrode 220, as illustrated in FIG. 3, the light conversion particles 330*b* move toward the second electrode 220 within the dispersion 330*a*. That is, the light conversion particles 330*b* move in one direction. Therefore, the receiving part 320 is driven as a light transmitting part.

Accordingly, in the embodiment, the light path control member is driven in two modes depending on the user's surrounding environment. That is, if the user wants light transmission only at a specific viewing angle, the receiving part is driven as a light blocking part. Alternatively, if the user wants a wide viewing angle and high brightness, the receiving part is driven as a light transmitting part.

Therefore, the light path control member according to the embodiment can be driven in two modes according to the user's needs. Therefore, the light path member can be applied regardless of the user's environment, etc.

As described above, the first electrode 210 and the second electrode 220 include different materials.

The first electrode 210 may include a metal. In detail, the first electrode 210 may include at least one metal among chromium (Cr), nickel (Ni), copper (Cu), aluminum (Al), silver (Ag), molybdenum (Mo), gold (Au), titanium (Ti), and an alloy thereof.

In addition, the first electrode 210 may include a metal nanowire or mesh electrode to implement light transmittance and low resistance.

For example, the first electrode 210 may include a plurality of metal nanowires. In addition, an overcoating layer may be disposed on the metal nanowires.

Alternatively, the first electrode 210 may include a plurality of conductive patterns. In detail, the first electrode 210 may include a plurality of mesh lines intersecting each other and a plurality of mesh openings formed by the mesh lines.

Accordingly, even if the first electrode 210 includes metal, the first electrode is not recognized from the outside. Therefore, the user's visibility is improved. In addition, the light transmittance is increased by the openings. Therefore, the brightness of the light path control member is improved.

In addition, the second electrode 220 may include a transparent conductive material. For example, the second electrode 220 may include a conductive material having a light transmittance of about 80% or more. For example, the second electrode 220 may include at least one metal oxide among indium tin oxide, indium zinc oxide, copper oxide, tin oxide, zinc oxide, and titanium oxide.

Since the first electrode 210 and the second electrode 220 include different materials, yellowing of the first electrode 210 and the second electrode 220 is reduced.

In detail, the first electrode 210 to which a negative voltage is applied includes a metal material. In addition, the second electrode 220 to which a positive voltage is applied includes a transparent metal oxide. Therefore, yellowing can be prevented inhibited from occurring in each electrode.

For example, the first electrode 210 may include a metal oxide such as indium tin oxide. When a negative voltage is applied, cations are generated. The cations move toward a surface of the first electrode 210 and in contact with the surface of the first electrode 210. In addition, tin (Sn2+) in a divalent oxidation state existing in the first electrode 210 meets the cations. Therefore, the tin changes into tin (Sn4+) in a tetravalent oxidation state by a following chemical reaction.

$$X^{+}+\mathrm{Sn}^{2+}=2X^{0}+\mathrm{Sn}^{4+}$$ [Chemical Formula]

Thereby, an oxidation number of tin increases on a surface of the first electrode 210. Accordingly, a color of the first electrode 210 changes. Accordingly, yellowing occurs in the first electrode.

Therefore, the light path control member forms the first electrode 210 as a metal, thereby inhibiting yellowing of the electrode due to the reaction.

The first electrode 210 to which the negative voltage is applied includes a metal. Accordingly, yellowing of the first electrode 210 is inhibited when the light path control member is driven.

However, since the first electrode 210 includes an opaque metal, the light transmittance of the light path control member may decrease. The light path control member includes a buffer layer 400 disposed between the first substrate 110 and the light conversion unit 300. For example, the buffer layer 400 is disposed between the first substrate 110 and the first electrode 210. Accordingly, the decrease in light transmittance due to the buffer layer 400 is mitigated.

The buffer layer 400 reduces light loss that may occur due to a difference in refractive index between the first substrate 110 and the first electrode 210.

The buffer layer 400 has a refractive index of a set size. In detail, a refractive index of the buffer layer 400 is smaller than a refractive index of the first electrode 210. In addition, a refractive index of the buffer layer 400 is smaller than a refractive index of the first substrate 110. In detail, the refractive indices of the first substrate 110, the first electrode 210, and the buffer layer 400 satisfy a following condition.

refractive index of the buffer layer<refractive index of the first electrode<refractive index of the first substrate Accordingly, the light incident on the first substrate 110 moves from the first substrate 110 toward the buffer layer 400 at an interface between the first substrate 110 and the buffer layer 400. In addition, the light moves from the buffer layer 400 toward the first electrode 210 at an interface between the buffer layer 400 and the first electrode 210.

Accordingly, the light moving in a lateral direction of the light path control member is reduced. That is, an emission angle of the light moving from the first substrate 110 toward the second substrate 120 is reduced. Accordingly, a direction of the light becomes closer to a front direction. Therefore, the leakage of the light to an outside of the light path control member during a movement of the light is reduced.

Figure 4A:
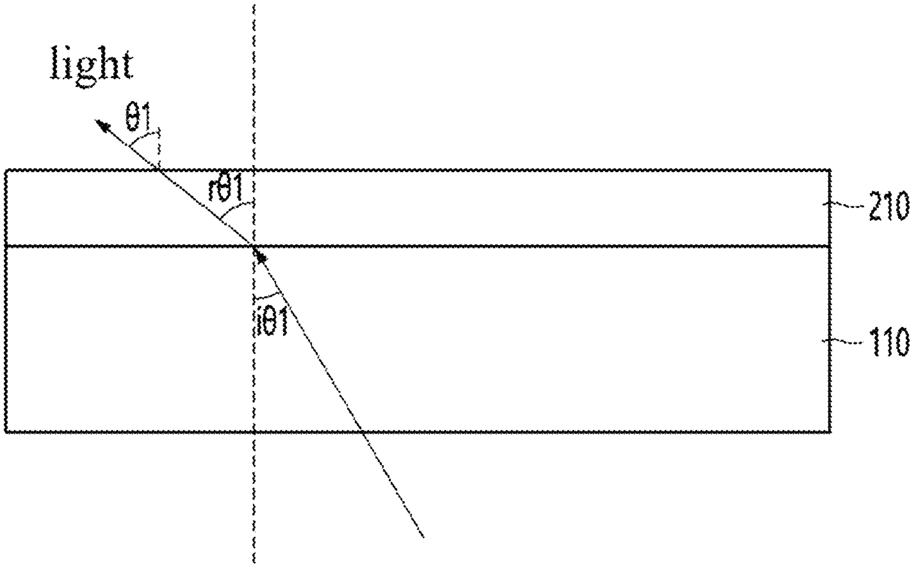
FIGS. 4(*a*) and 4(*b*) are cross-sectional views for explaining a light path according to a presence or absence of a buffer layer in a light path control member according to an embodiment.
Figure 4B:
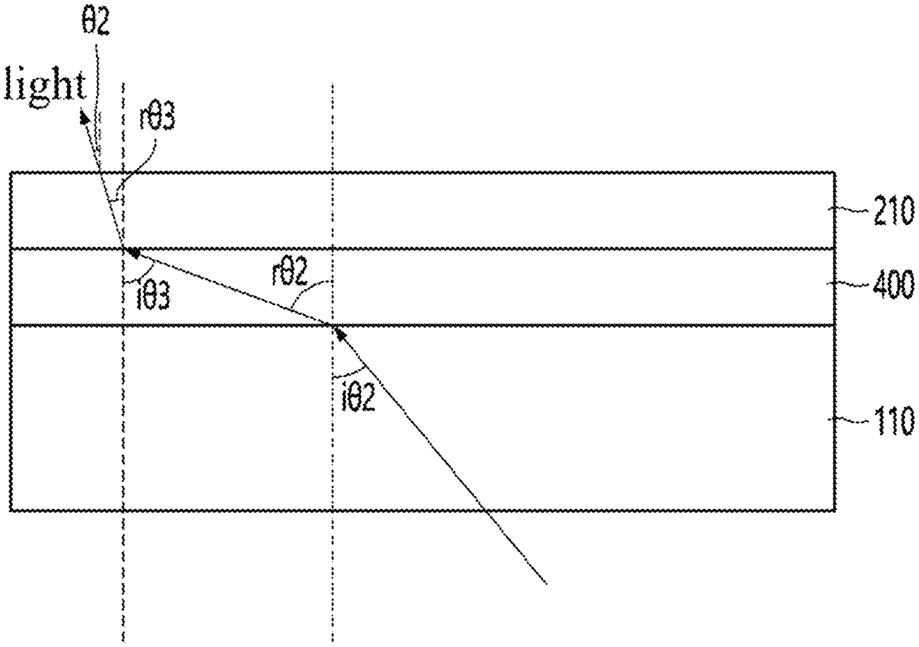

FIGS. 4(*a*) and 4(*b*) are views for comparing a path of light depending on whether the buffer layer 400 is disposed. Hereinafter, a case where the light is incident on the first substrate 110 and moves toward the second substrate 120 will be described.

Referring to FIG. 4(*a*), when the buffer layer 400 is not disposed, the light incident on the first substrate 110 and emitted to the outside of the first electrode 210 has a first emission angle θ1.

In addition, referring to FIG. 4(*b*), when the buffer layer 400 is disposed, light incident from the first substrate 110, passing through the buffer layer 400, and emitted to an outside of the first electrode 210 has a second emission angle θ2.

When the buffer layer 400 is disposed, a refractive angle refracted at the interface between the buffer layer 400 and the first electrode 210 is reduced.

As a result, an emission angle of light emitted to an outside of the first electrode 210 is reduced.

Referring to FIG. 4(*a*), since a refractive index of the first substrate 110 is greater than a refractive index of the first electrode 210, a first refractive angle (rθ1) of light at the interface between the first substrate 110 and the first electrode 210 becomes greater than a first incident angle (iθ1) of light. Accordingly, light passing through the first electrode 210 and emitted outside the first electrode 210 is emitted at the first emission angle θ1, which is the first refractive angle (rθ1).

On the other hand, referring to FIG. 4(*b*), since a refractive index of the first substrate 110 is greater than a refractive index of the buffer layer 210, a second refractive angle (rθ2) of light at the interface between the first substrate 110 and the buffer layer 400 becomes greater than a second incident angle (iθ2) of light. At this time, a difference in the refractive indices between the first substrate 110 and the buffer layer 400 is greater than a difference in the refractive indices between the first substrate 110 and the first electrode 210. Accordingly, a second refractive angle (rθ2) at the interface between the first substrate 110 and the buffer layer 400 is greater than a refractive angle (rθ1) of light at the interface between the first substrate 110 and the first electrode 210.

In addition, a third refractive angle (rθ2) of light at the interface between the buffer layer 400 and the first electrode 210 becomes smaller than a third incident angle (iθ3) of light due to a difference in refractive index between the buffer layer 400 and the first electrode 210. Accordingly, light passing through the first electrode 210 and emitted outside the first electrode 210 is emitted at the second emission angle θ2, which is the third refractive angle (rθ3).

Therefore, an emission angle of light emitted from the first substrate 110 to the first electrode 210 decreases. Accordingly, the light is emitted closer to a front direction. Accordingly, light can be inhibited from being transmitted in a lateral direction of the light path control member. Therefore, the light path control member according to the embodiment has improved frontal brightness.

A thickness and refractive index of the buffer layer 400 have a size set according to the refractive index of the first substrate 110 and the first electrode 210.

The refractive index of the first substrate 110 may be 1.5 or more. In detail, the refractive index of the first substrate 110 may be 1.5 to 1.7. In more detail, the refractive index of the first substrate 110 may be 1.55 to 1.65. In more detail, the refractive index of the first substrate 110 may be 1.61 to 1.64.

In addition, the refractive index of the first electrode 210 may be 1.4 or more. In detail, the refractive index of the first electrode 210 may be 1.4 to 1.6. In more detail, the refractive index of the first electrode 210 may be 1.45 to 1.55. The first electrode 210 may have a refractive index smaller than that of the first substrate 110 within the above range.

In addition, the thickness of the buffer layer 400 may be 300 nm or more. In detail, the thickness of the buffer layer 400 may be 300 nm to 3000 nm. More specifically, the thickness of the buffer layer 400 may be 500 nm to 2000 nm.

In addition, the refractive index of the buffer layer 400 may be 1.3 or more. In detail, the refractive index of the buffer layer 400 may be 1.3 to 1.5. More specifically, the refractive index of the buffer layer 400 may be 1.3 to 1.35.

The buffer layer 400 may have a refractive index smaller than that of the first substrate 110 and the first electrode 210 within the above range.

In addition, the refractive index of the first substrate 110 may be 1.35 times, 1.25 times, or 1.15 times or less than the refractive index of the buffer layer 400.

If the refractive index of the first substrate 110 exceeds 1.35 times the refractive index of the buffer layer 400, the refractive angle refracted at the interface between the first substrate 110 and the buffer layer 400 increases. Accordingly, the amount of light lost in the lateral direction of the buffer layer 400 increases.

In addition, the refractive index of the buffer layer 400 may be 0.8 times or more, 0.85 times or more, 0.9 times or more, or 0.95 times or more than the refractive index of the first electrode 210.

If the refractive index of the buffer layer 400 is less than 0.8 times the refractive index of the first electrode 210, a refractive angle refracted at the interface between the buffer layer 400 and the first electrode 210 increases. As a result, the emission angle of light passing through the first electrode 210 increases.

Hereinafter, a light path control member according to another embodiment will be described with reference to FIGS. 5 to 9.

Figure 5:
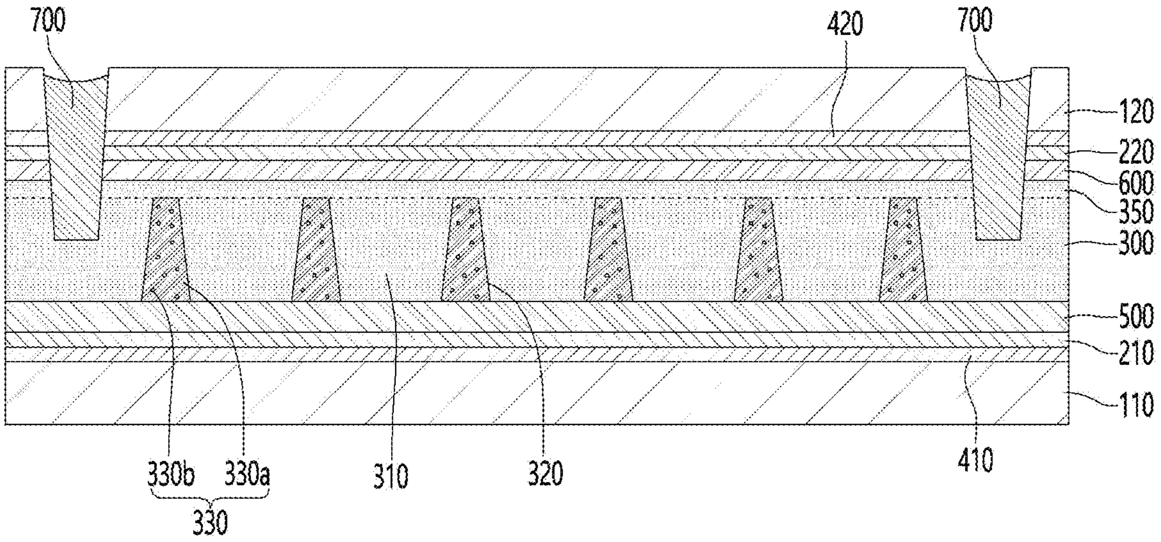
FIG. 5 to FIG. 9 are cross-sectional views of a light path control member according to another embodiment.

Referring to FIG. 5, the light path control member includes a plurality of buffer layers. In detail, the buffer layers include a first buffer layer 410 and a second buffer layer 420. Since the first buffer layer 410 is the same as or similar to the buffer layers of FIGS. 2 to 4(*b*) described above, the following description is omitted.

The first buffer layer 410 may be disposed between the first substrate 110 and the first electrode 210 as in the buffer layer 400 described in FIGS. 2 to 4(*b*).

The second buffer layer 420 is disposed between the second substrate 120 and the second electrode 220.

The loss of light due to the difference in refractive indices between the second substrate 120 and the second electrode 220 is reduced by the second buffer layer 420.

The second buffer layer 420 has a refractive index of a set size. In detail, a refractive index of the second buffer layer 420 is smaller than a refractive index of the second electrode 220. In addition, a refractive index of the second buffer layer 420 is smaller than a refractive index of the second substrate 120. In detail, the refractive indices of the second substrate 120, the second electrode 220, and the second buffer layer 420 satisfy the following condition.

refractive index of the second buffer layer<refractive index of the second electrode<refractive index of the second substrate.

Accordingly, the light incident on the second electrode 220 moves from the second electrode 220 toward the second buffer layer 420 at the interface between the second electrode 220 and the second buffer layer 420. In addition, the light incident on the second electrode 220 moves from the second buffer layer 420 toward the second substrate 120 at the interface between the second buffer layer 420 and the second substrate 120.

Accordingly, the light incident on the second electrode 220 and moving toward the second substrate 120 is reduced from moving in a lateral direction of the light path control member. That is, an emission angle of the light moving from the first substrate 110 toward the second substrate 120 is reduced.

The first buffer layer 410 can control a direction of light movement between the first substrate 110 and the first electrode 210 to be close to a front direction. In addition, the second buffer layer 420 can control a direction of light movement between the second substrate 120 and the second electrode 220 to be close to a front direction.

Accordingly, when light moving from the first substrate 110 toward the second substrate 120 is emitted to the outside of the second substrate 120, the light has an emission angle close to the front direction.

Therefore, light moving in the lateral direction of the light path control member is reduced. Accordingly, light loss of the light path control member is reduced. Therefore, the light path control member according to the embodiment has improved brightness.

Meanwhile, the thickness, refractive index and relationship thereof of the second buffer layer, the second substrate and the second electrode are the same as or similar to the thickness, refractive index and relationship thereof of the first buffer layer, the first substrate and the first electrode described above. Therefore, the description below is omitted.

Figure 6:
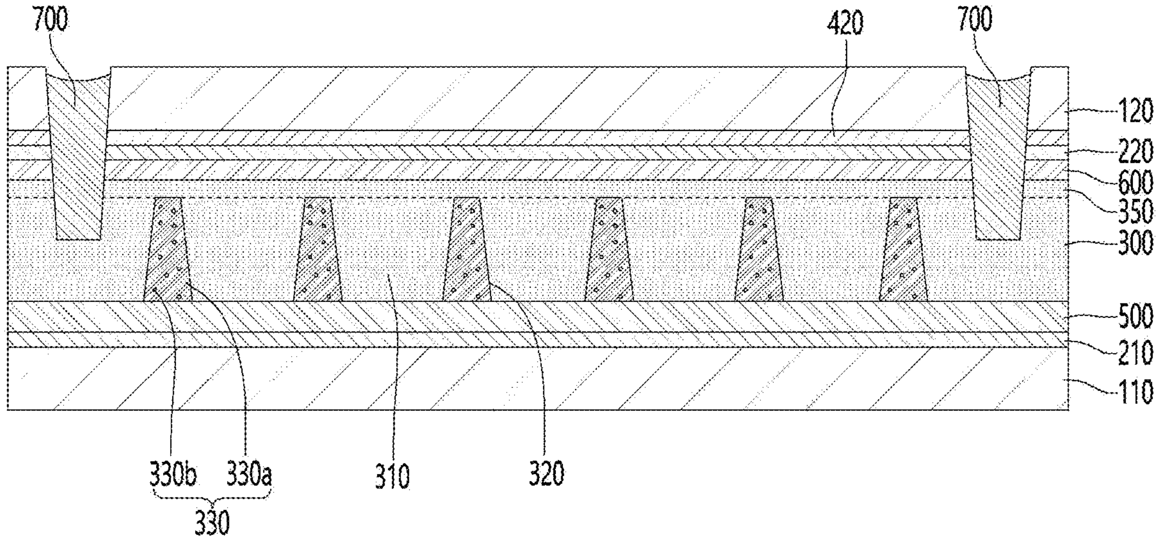

Meanwhile, referring to FIG. 6, the light path control member according to another embodiment includes only one buffer layer. In detail, the light path control member includes only the second buffer layer 420 described above. Since the second buffer layer 420 is the same as or similar to the second buffer layer of FIG. 5 described above, the description below is omitted.

Figure 7:
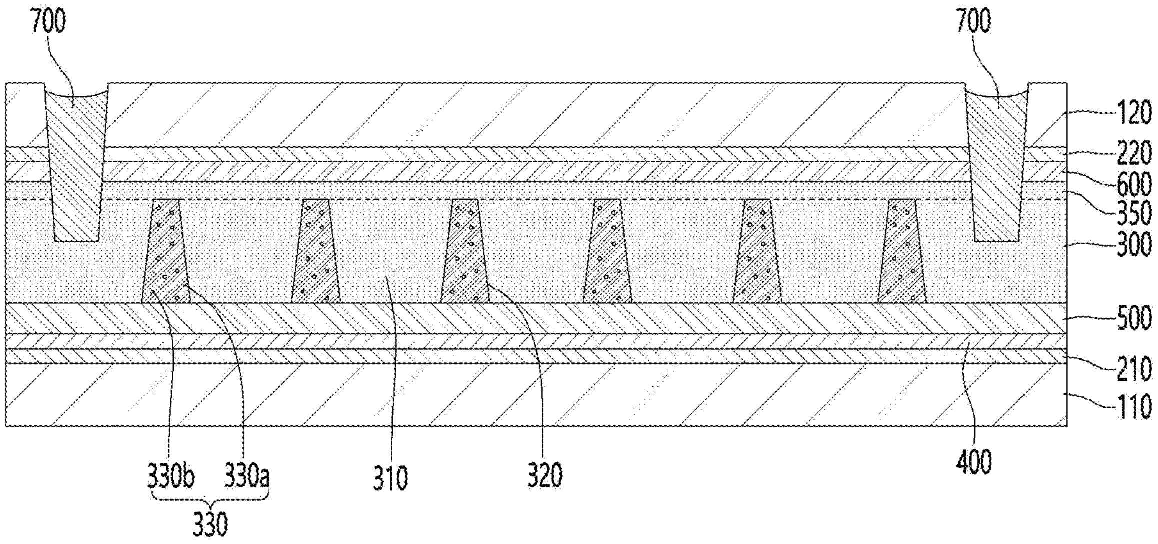
Figure 8:
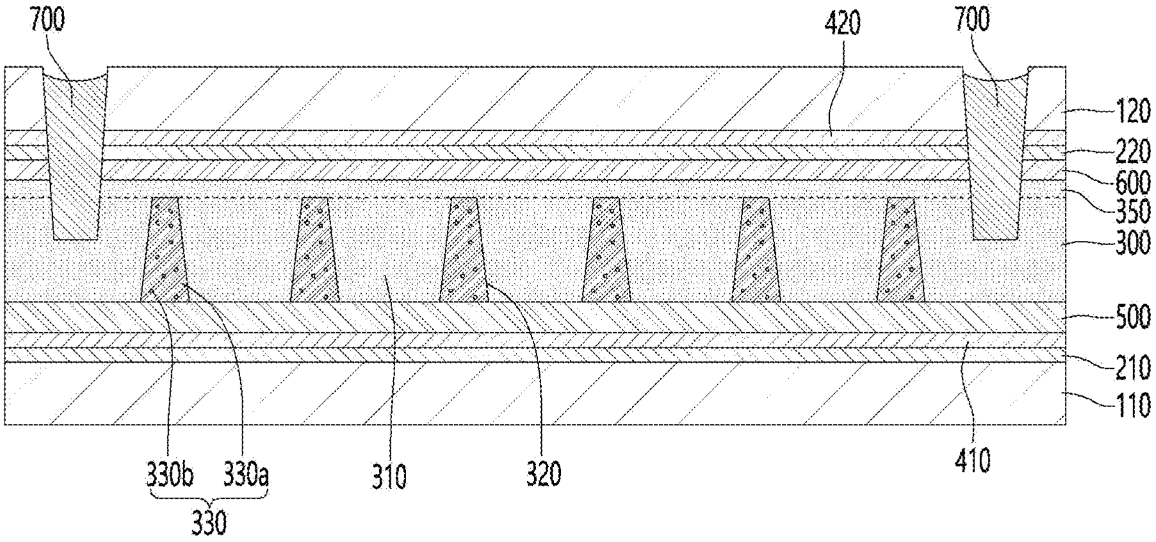
Figure 9:
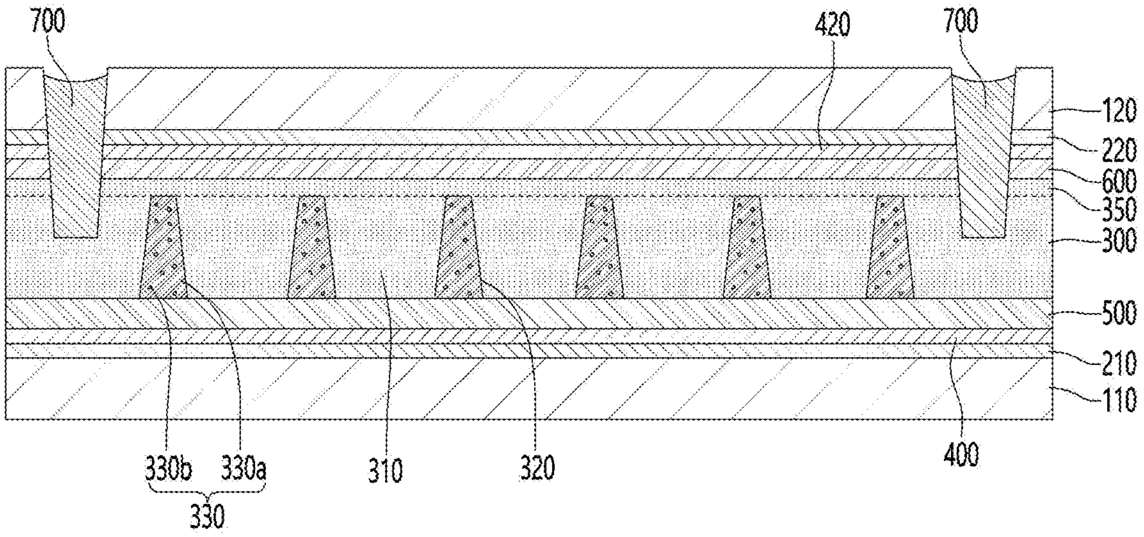

Referring to FIGS. 7 to 9, a position of the buffer layer of the light path control member according to another embodiment is different from a position of the buffer layer described above. In addition, the buffer layer includes a plurality of buffer layers.

Referring to FIG. 7, a position of the buffer layer 400 is different from a position of the buffer layer described above. In detail, the buffer layer 400 is disposed between the first electrode 210 and the light conversion unit 300. More specifically, the buffer layer 400 is disposed between the first electrode 210 and the adhesive layer 500.

The buffer layer 400 reduces the loss of light due to the difference in refractive indices between the second substrate 120 and the second electrode 220 between the first electrode 210 and the light conversion unit 300.

The buffer layer 400 has a refractive index of a set size. In detail, the refractive index of the buffer layer 400 is smaller than the refractive index of the first substrate 110. In addition, the refractive index of the buffer layer 400 is larger than the refractive index of the first electrode 210. In detail, the refractive indices of the first substrate 110, the first electrode 210, and the buffer layer 400 satisfy the following condition.

refractive index of the First electrode<refractive index of the buffer layer<refractive index of the first substrate Accordingly, the light incident on the first substrate 110 moves from the first substrate 110 toward the first electrode 210 at the interface between the first substrate 110 and the first electrode 210. In addition, the light incident on the first substrate 110 moves from the first electrode 210 toward the buffer layer 400 at the interface between the first electrode 210 and the buffer layer 400.

Accordingly, the light incident on the first substrate 110 and moving toward the buffer layer 400 is reduced from moving toward the lateral direction of the light path control member. That is, an emission angle of light moving from the first substrate 110 toward the second substrate 120 is reduced.

That is, the buffer layer 400 controls a direction of light movement between the first substrate 110 and the first electrode 210 to be close to the front direction.

Accordingly, when light moving from the first substrate 110 toward the second substrate 120 is emitted to the outside of the second substrate 120, the light has an emission angle close to the front direction.

Therefore, light moving in the lateral direction of the light path control member is reduced. Accordingly, the light loss of the light path control member is reduced. Therefore, the light path control member according to the embodiment has improved brightness.

Referring to FIGS. 8 and 9, the buffer layer includes a plurality of buffer layers. In detail, the buffer layer includes a first buffer layer 410 and a second buffer layer 420. The first buffer layer 410 is identical or similar to the buffer layer of FIG. 6 described above, so the following description is omitted.

The first buffer layer 410 is disposed between the first electrode 210 and the light conversion unit 300, to correspond the buffer layer 400 described in FIG. 6.

Referring to FIG. 8, the second buffer layer 420 is disposed between the second substrate 120 and the second electrode 220.

Alternatively, referring to FIG. 9, the second buffer layer 420 is disposed between the second electrode 220 and the light conversion unit 300. Alternatively, the second buffer layer 420 is disposed between the second electrode 220 and the above primer layer 600.

For example, the primer layer 600 is disposed between the second buffer layer 420 and the light conversion unit 300. Alternatively, the second buffer layer 420 may be the primer layer. That is, the second buffer layer 420 may be the primer layer.

The second buffer layer 420 reduces the loss of light due to the difference in refractive index between the second substrate 120 and the second electrode 220 between the second substrate 210 and the light conversion unit 300.

To this end, the second buffer layer 420 has a refractive index of a set size.

For example, when the second buffer layer 420 is disposed between the second substrate 120 and the second electrode 220 as shown in FIG. 8, the refractive index of the second buffer layer 420 is smaller than the refractive index of the second electrode 220. In addition, the refractive index of the second buffer layer 420 is smaller than the refractive index of the second substrate 120. In detail, the refractive indices of the second substrate 120, the second electrode 220, and the second buffer layer 420 satisfy a following condition.

refractive index of the second buffer layer<refractive index of the second electrode<refractive index of the second substrate Accordingly, light incident on the second electrode 220 moves from the second electrode 220 to the second buffer layer 420 at the interface of the second electrode 220 and the second buffer layer 420. In addition, light incident on the second electrode 220 moves from the second buffer layer 420 to the second substrate 120 at the interface between the second buffer layer 420 and the second substrate 120.

Alternatively, when the second buffer layer 420 is disposed between the second electrode 220 and the light conversion unit 300, the refractive index of the second buffer layer 420 is smaller than the refractive index of the second substrate 120. In addition, the refractive index of the second buffer layer 420 is larger than the refractive index of the second electrode 220. In detail, the refractive indices of the second substrate 120, the second electrode 220, and the second buffer layer 420 satisfy the following conditions.

refractive index of the second electrode<refractive index of the second buffer layer<refractive index of the second substrate Accordingly, light incident on the second buffer layer 420 moves from the second buffer layer 420 toward the second electrode 220 at the interface between the second electrode 220 and the second buffer layer 420. In addition, light incident on the second buffer layer 420 moves from the second electrode 220 toward the second substrate 120 at the interface between the second electrode 420 and the second substrate 120.

Therefore, light incident on the second electrode 220 or the second buffer layer 420 and moving toward the second substrate 120 is reduced from moving toward the lateral direction of the light path control member. That is, the emission angle of the light moving from the first substrate 110 toward the second substrate 120 is reduced.

That is, the first buffer layer 410 controls a direction of the light moving between the first substrate 110 and the first electrode 210 to be close to the front direction. In addition, the second buffer layer 420 controls a direction of the light moving between the second substrate 120 and the second electrode 220 to be close to the front direction.

Accordingly, when the light moving from the first substrate 110 toward the second substrate 120 is emitted to the outside of the second substrate 120, the light has an emission angle close to the front direction.

Therefore, the light moving in the lateral direction of the light path control member is reduced. Therefore, the light loss of the light path control member is reduced. Therefore, the light path control member according to the embodiment has improved brightness.

Hereinafter, the present invention will be described in more detail through measurements of light transmittance of light path control members according to examples and comparative examples. These examples are merely presented as examples in order to describe the present invention in more detail. Therefore, the present invention is not limited to these examples.

EXAMPLE

Silver (Ag) nanowires are disposed on one surface of a first substrate containing polyethylene terephthalate (PET). Thus, a first electrode is formed. In addition, indium tin oxide (ITO) is disposed on one surface of a second substrate containing polyethylene terephthalate (PET). Thus, a second electrode is formed.

At this time, a buffer layer containing a resin material is disposed between the first substrate and the first electrode.

Next, a urethane-based or epoxy-based primer layer is formed on the second electrode.

Then, a pattern is formed on the resin layer by an imprinting process. Thus, a receiving part is formed.

Next, an adhesive layer including an optically clear adhesive (OCA) is disposed on the resin layer. The resin layer and the first substrate are bonded by the adhesive layer.

Next, a plurality of cutting regions are formed in the first substrate or the second substrate. In addition, a light conversion material is filled inside the receiving part. Next, a sealing material is filled in the cutting region. Next, the sealing material is cured by irradiating UV. Thereby, a light path control member is manufactured.

At this time, a refractive index of the first substrate was about 1.63 and a thickness was about 125 um.

In addition, a refractive index of the first electrode was about 1.5 and a thickness was about 90 nm.

In addition, a refractive index of the second substrate was about 1.64 and a thickness was about 50 um.

In addition, a refractive index of the second electrode was about 1.5 and a thickness was about 200 nm.

In addition, a refractive index of the primer layer was about 1.487 and a thickness was about 10 um.

In addition, a refractive index of the adhesive layer was about 1.489 and a thickness was about 20 um.

In addition, a refractive index of the resin layer was about 1.487 and a thickness was about 95 um.

Next, the light transmittance of the light path control member according to the thickness and refractive index of the buffer layer was measured.

Comparative Example 1

A light path control member was manufactured corresponding to a process in which the example is manufactured, except that a buffer layer was not disposed between the first substrate and the first electrode.

Next, the light transmittance of the light path control member according to a thickness and refractive index of the buffer layer was measured.

Comparative Example 2

A light path control member was manufactured corresponding to a process in which the example is manufactured, except that the first electrode included indium tin oxide (ITO) and that a buffer layer was not disposed between the first substrate and the first electrode.

Next, the light transmittance of the light path control member according to a thickness and refractive index of the buffer layer is measured.

Figure 10:
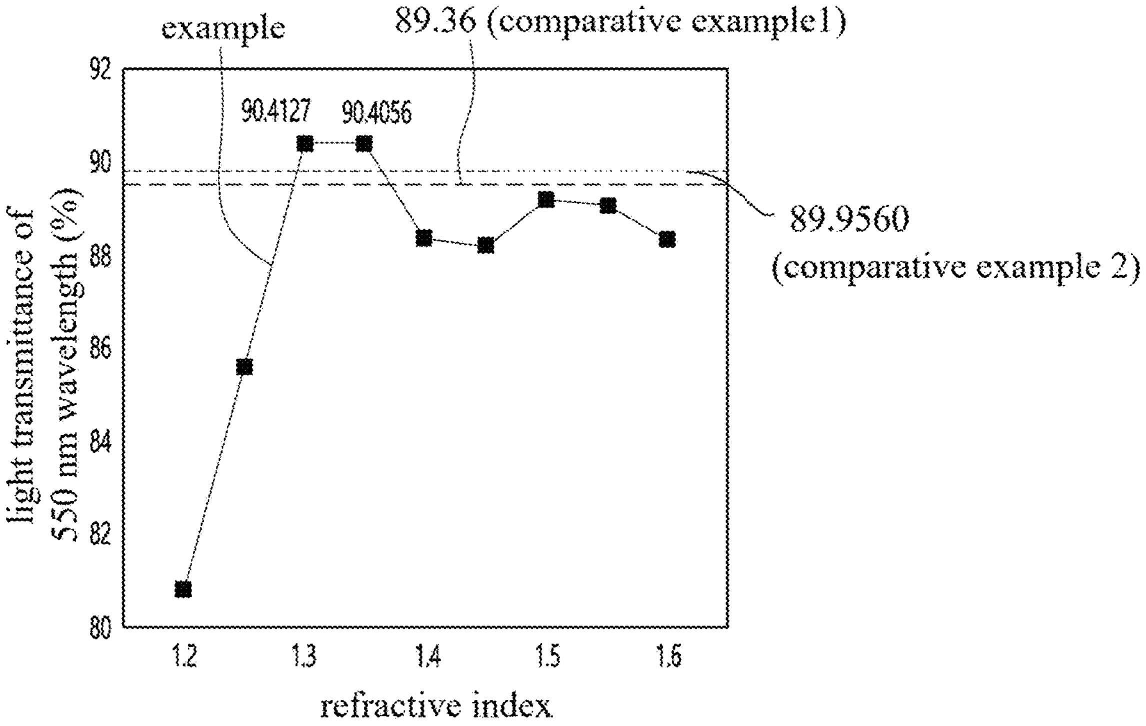
FIG. 10 and FIG. 11 are graphs for explaining light transmittance according to a refractive index and a thickness of a light path control member according to an embodiment and a comparative example.
Figure 11:
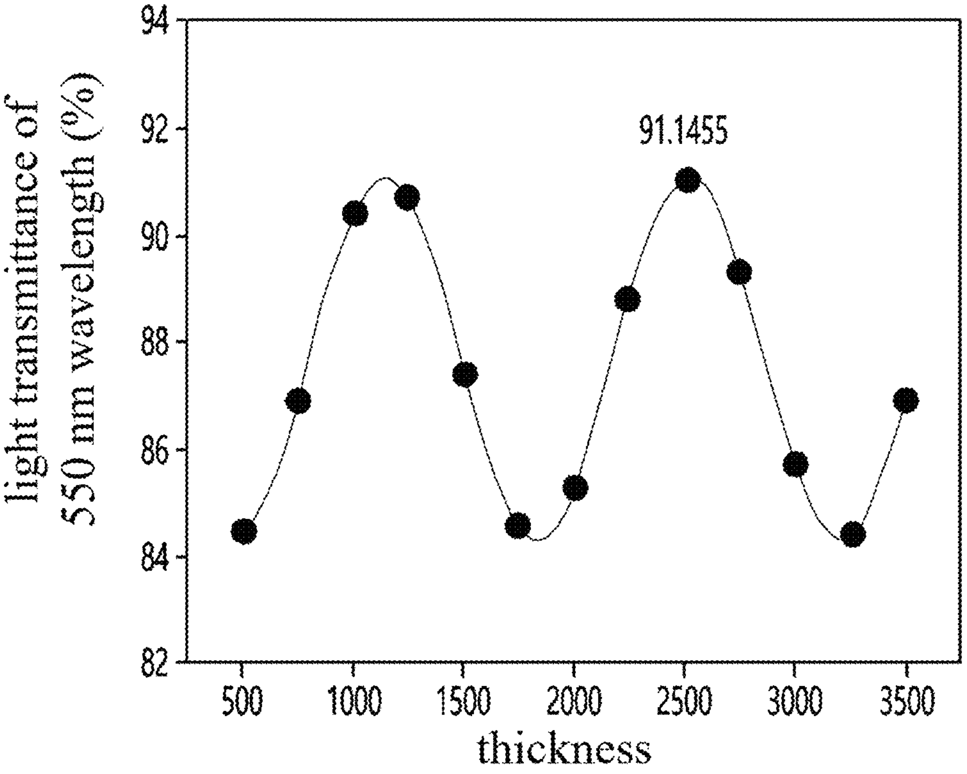

Referring to FIGS. 10 and 11, the light path control member according to the embodiment has improved light transmittance compared to the light path control member according to the comparative example.

In detail, when the light path control member according to the embodiment has a refractive index and thickness within a set range, the light transmittance of the light path control member according to the embodiment is higher than the light transmittance of the light path control member according to the comparative example.

Therefore, since the first electrode of the light path control member according to the embodiment is formed of metal, a yellowing phenomenon of the light path control member is inhibited. Accordingly, the user's visibility is improved.

In addition, the light path control member according to the embodiment includes a buffer layer. Therefore, even if the first electrode of the light path control member includes an opaque metal, the light path control member can have high light transmittance. Therefore, the frontal brightness of the light path control member is improved.

Hereinafter, a display device and a display device to which an light path control member according to an embodiment is applied will be described with reference to FIGS. 12 to 18.

Figure 12:
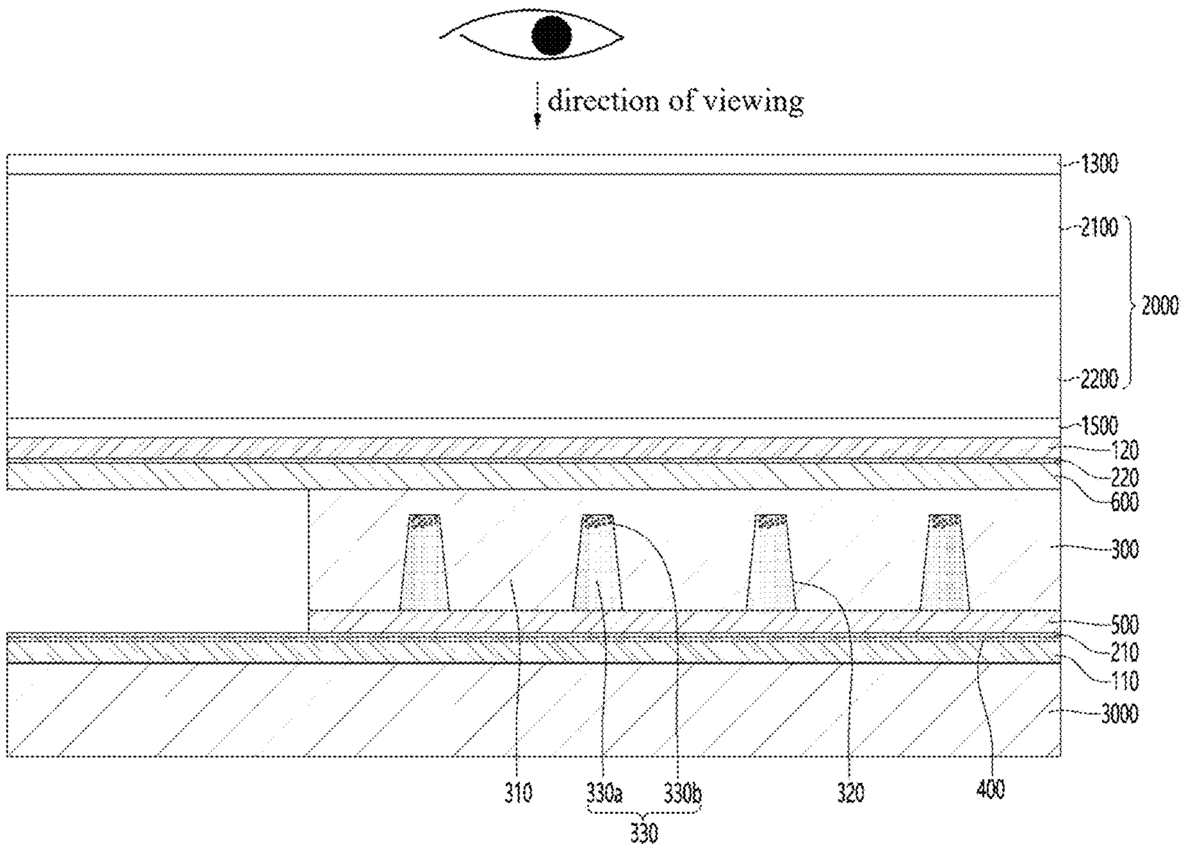
FIG. 12 and FIG. 13 are cross-sectional views of a display device to which a light path control member according to an embodiment is applied.
Figure 13:
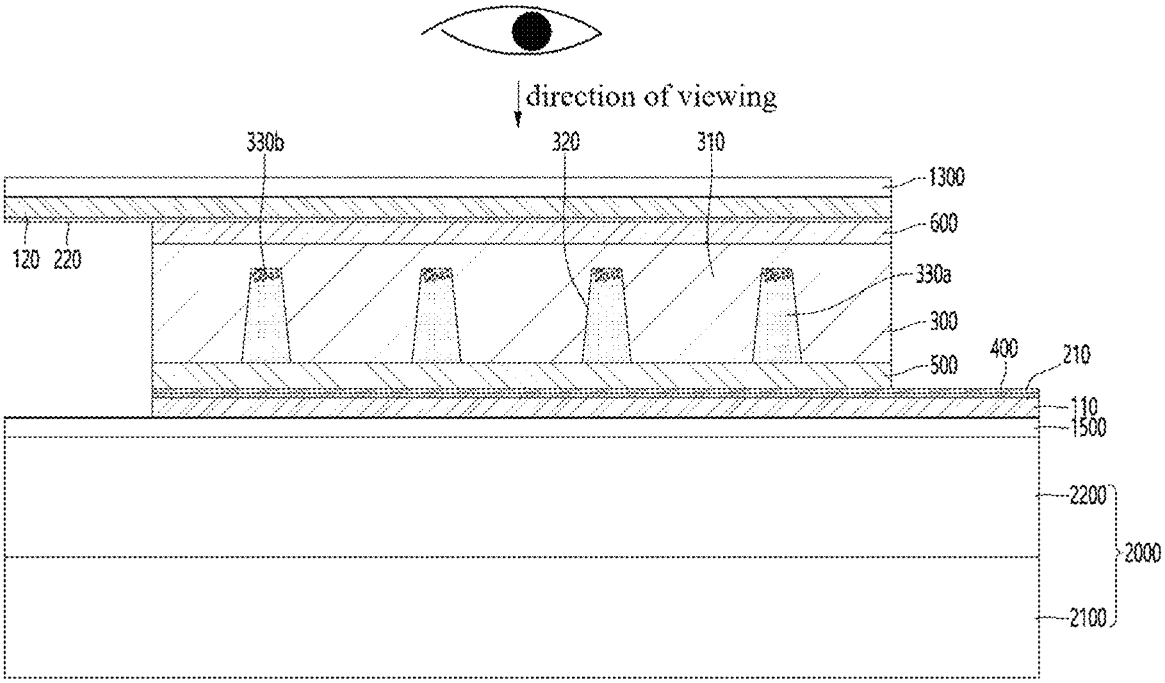

Referring to FIGS. 12 and 13, the light path control member 1000 according to the embodiment may be disposed on or below the display panel 2000.

The display panel 2000 and the light path control member 1000 may be disposed to be adhered to each other. For example, the display panel 2000 and the light path control member 1000 may be adhered to each other via an adhesive layer 1500. The adhesive layer 1500 may be transparent. For example, the adhesive layer 1500 may include an adhesive or an adhesive layer including an optical transparent adhesive material.

The adhesive layer 1500 may include a release film. In detail, when adhering the light path control member and the display panel, the light path control member and the display panel may be adhered after the release film is removed.

The display panel 2000 may include a first base substrate 2100 and a second base substrate 2200. The display panel 2000 may be formed in a structure in which the first base substrate 2100 including a thin film transistor (TFT) and a pixel electrode and the second base substrate 2200 including color filter layers are bonded to each other with a liquid crystal layer interposed therebetween.

In addition, the display panel 2000 may be a liquid crystal display panel of a color filter on transistor (COT) structure in which a thin film transistor, a color filter, and a black electrolyte are formed at the first base substrate 2100 and the second base substrate 2200 is bonded to the first base substrate 2100 with the liquid crystal layer interposed therebetween. That is, a thin film transistor may be formed on the first base substrate 2100, a protective film may be formed on the thin film transistor, and a color filter layer may be formed on the protective film. In addition, a pixel electrode in contact with the thin film transistor may be formed on the first base substrate 2100. At this point, in order to improve an aperture ratio and simplify a masking process, the black electrolyte may be omitted, and a common electrode may be formed to function as the black electrolyte.

When the display panel 2000 is a liquid crystal display panel, the light path control member may be formed on an upper portion of the liquid crystal panel. That is, when a surface of the liquid crystal panel that the user views is defined as the upper portion of the liquid crystal panel, the light path control member may be disposed on the upper portion of the liquid crystal panel. That is, as shown in FIG. 12, the light path control member may be disposed on the lower portion of the liquid crystal panel and the upper portion of the backlight unit 3000, so that the light path control member may be disposed between the backlight unit 3000 and the display panel 2000.

Alternatively, as shown in FIG. 13, when the display panel 2000 is an organic light emitting diode panel, the light path control member may be formed on the organic light emitting diode panel. That is, when the surface viewed by the user in the organic light emitting diode panel is defined as an upper portion of the organic light emitting diode panel, the light path control member may be disposed on the organic light emitting diode panel. The display panel 2000 may include a self-luminous element that does not require a separate light source. In the display panel 2000, a thin film transistor may be formed on the first base substrate 2100, and an organic light emitting element in contact with the thin film transistor may be formed. The organic light emitting element may include an anode, a cathode, and an organic light emitting layer formed between the anode and the cathode. In addition, the second base substrate 2200 configured to function as an encapsulation substrate for encapsulation may be further included on the organic light emitting element.

In addition, although not shown in drawings, a polarizing plate may be further disposed between the light path control member 1000 and the display panel 2000. The polarizing plate may be a linear polarizing plate or an external light reflection preventive polarizing plate. For example, when the display panel 2000 is a liquid crystal display panel, the polarizing plate may be the linear polarizing plate. Further, when the display panel 2000 is the organic light emitting diode panel, the polarizing plate may be the external light reflection inhibiting polarizing plate.

In addition, an additional functional layer 1300 such as an anti-reflection layer, an anti-glare, or the like may be further disposed on the light path control member 1000. Specifically, the functional layer 1300 may be adhered to one surface of the second substrate 120 of the light path control member. Although not shown in drawings, the functional layer 1300 may be adhered to the first substrate 110 of the light path control member via an adhesive layer. In addition, a release film for protecting the functional layer may be further disposed on the functional layer 1300.

Further, a touch panel may be further disposed between the display panel and the light path control member.

It is shown in the drawings that the light path control member is disposed at an upper portion of the display panel, but the embodiment is not limited thereto, and the light path control member may be disposed at various positions such as a position in which light is adjustable, that is, a lower portion of the display panel, or between a second substrate and a first substrate of the display panel, or the like.

Referring to FIGS. 14 to 18, an light path control member according to an embodiment may be applied to various display devices.

Figure 14:
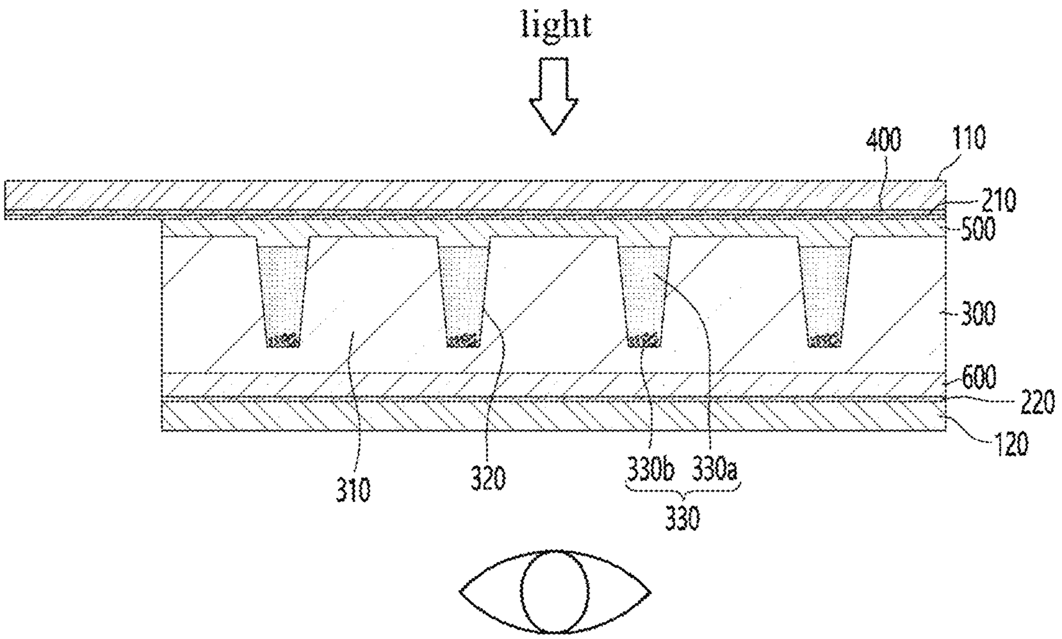
FIG. 14 to FIG. 18 are views for explaining an example of a display device to which a light path control member according to an embodiment is applied.
Figure 14:
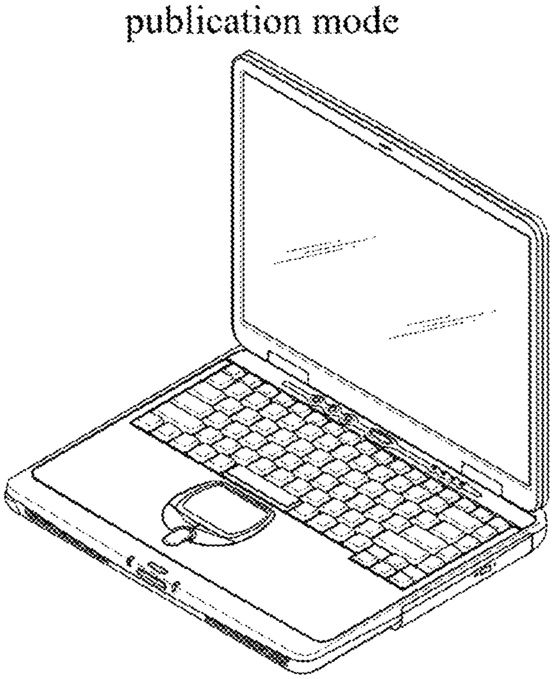
Figure 15:
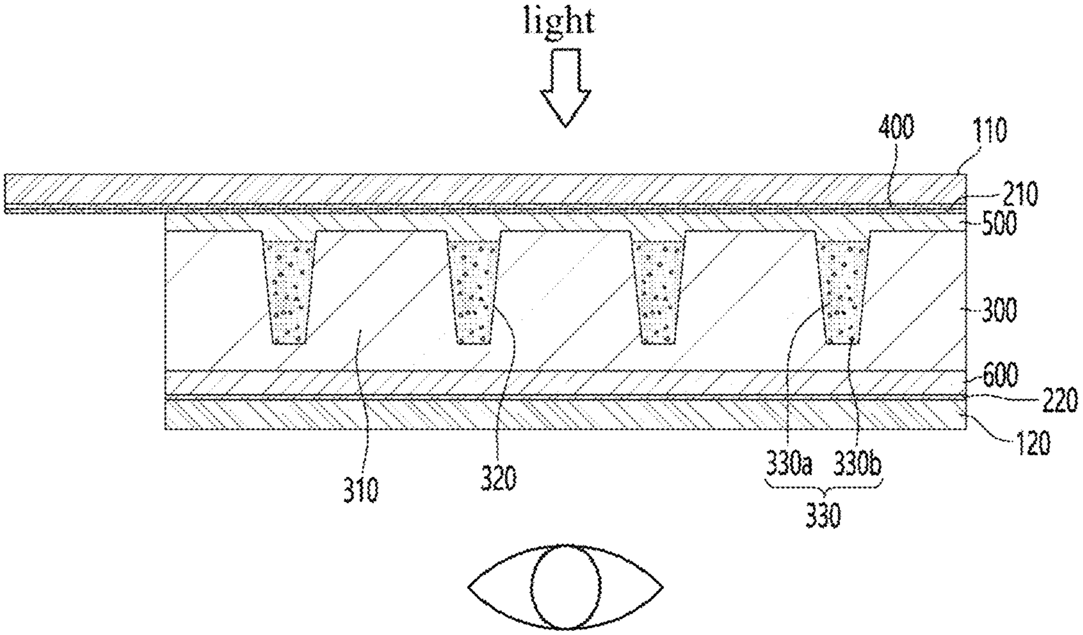
Figure 15:
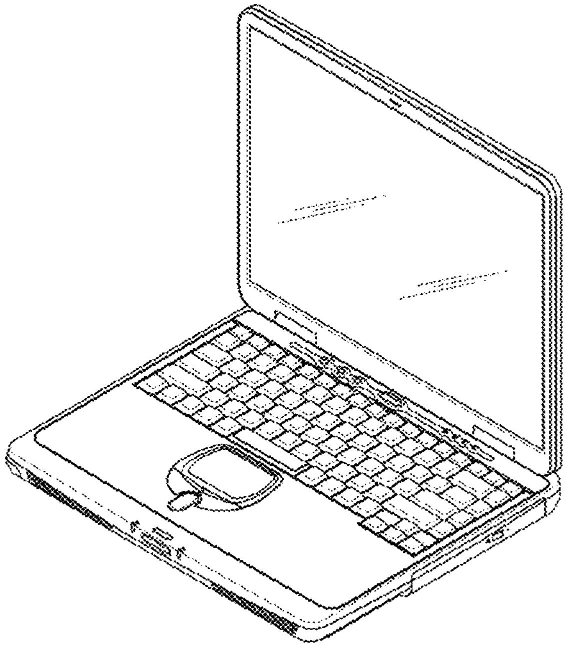

Referring to FIGS. 14 and 15, the light path control member according to an embodiment may be applied to a display device that displays a display.

For example, when power is applied to the light path control member as shown in FIG. 14, the receiving part functions as the light transmitting part, so that the display device may be driven in the public mode, and when power is not applied to the light path control member as shown in FIG. 15, the receiving part functions as the light blocking part, so that the display device may be driven in the privacy mode.

Accordingly, a user may easily drive the display device in a publication mode or a privacy mode according to application of power.

Light emitted from the backlight unit or the self-luminous element may move from the first substrate toward the second substrate. Alternatively, the light emitted from the backlight unit or the self-luminous element may also move from the first substrate toward the second substrate.

Figure 16:
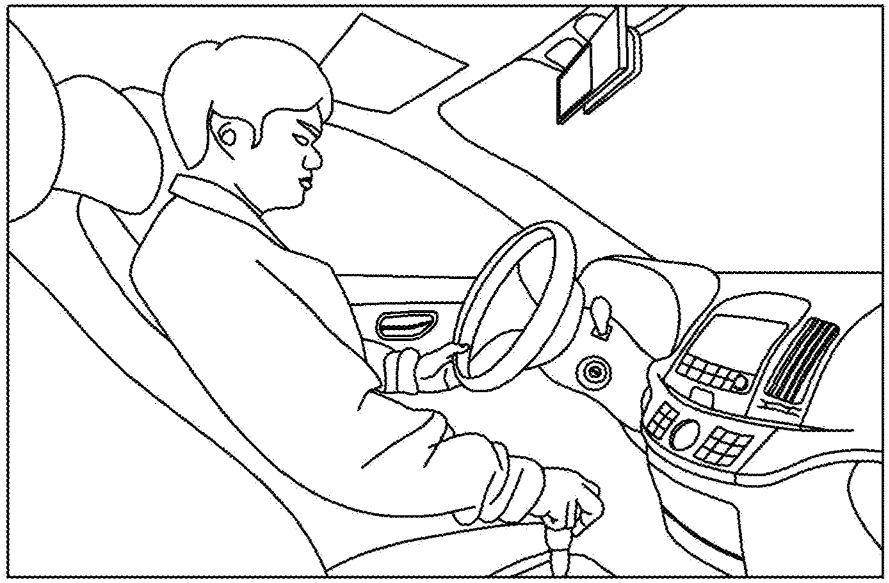
Figure 17:
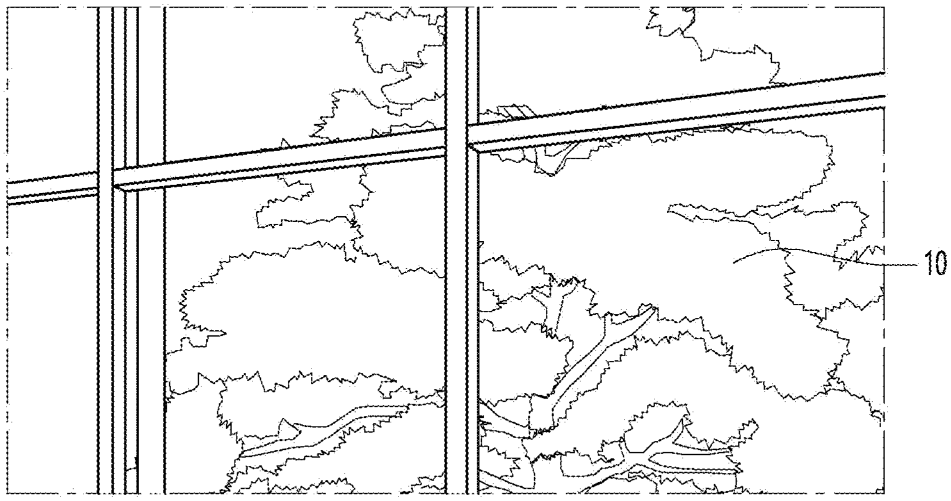
Figure 18:
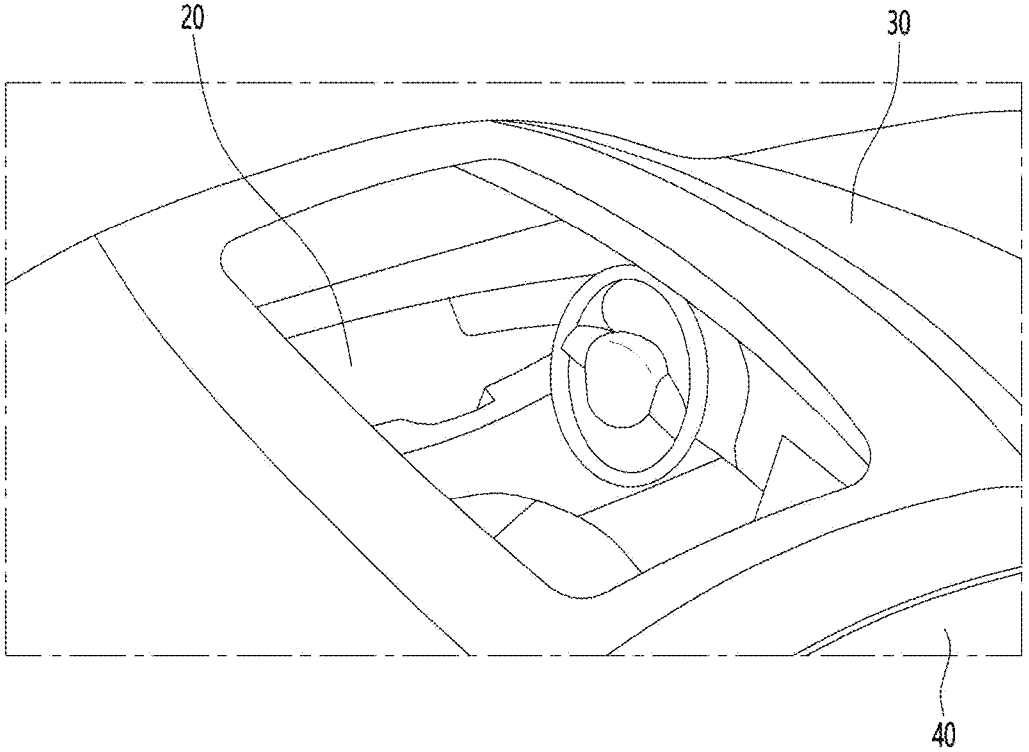

In addition, referring to FIGS. 16 to 18, the display device to which a light path control member according to an embodiment is applied can also be applied to an interior and exterior of a vehicle and windows of a building.

For example, the display device including the light path control member according to the embodiment as shown in FIG. 16 can display a video confirming information of the vehicle and a movement route of the vehicle. The display device may be disposed between a driver seat and a passenger seat of the vehicle.

In addition, the light path control member according to the embodiment may be applied to a dashboard that displays a speed, an engine, an alarm signal, and the like of the vehicle.

In addition, the light path control member according to the embodiment as shown in FIG. 17 can be applied to the window 10 of the building. Accordingly, the amount of light passing through the window 10 can be controlled.

In addition, the light path control member according to the embodiment as shown in FIG. 18 can be applied to a sunroof 20, a front windshield 30, or left and right windows 40 of the vehicle.

The characteristics, structures, effects, and the like described in the above-described embodiments are included in at least one embodiment of the present invention, but are not limited to only one embodiment. Furthermore, the characteristic, structure, and effect illustrated in each embodiment may be combined or modified for other embodiments by a person skilled in the art. Accordingly, it is to be understood that such combination and modification are included in the scope of the present invention.

In addition, embodiments are mostly described above, but the embodiments are merely examples and do not limit the present invention, and a person skilled in the art may appreciate that several variations and applications not presented above may be made without departing from the essential characteristic of embodiments. For example, each component specifically represented in the embodiments may be varied. In addition, it should be construed that differences related to such a variation and such an application are included in the scope of the present invention defined in the following claims.

The invention claimed is:

1. An light path control member comprising:

a first substrate;

a first electrode disposed on the first substrate;

a second substrate disposed on the first substrate;

a second electrode disposed under the second substrate;

a light conversion unit disposed between the first electrode and the second electrode and including a receiving part configured to receive a light conversion material; and a buffer layer disposed between the first substrate and the light conversion unit, wherein the first electrode and the second electrode include different materials, wherein a positive voltage and a negative voltage are applied to the first electrode and the second electrode, wherein an electrode to which the positive voltage is applied includes a metal oxide, and wherein an electrode to which the negative voltage is applied includes a metal material.

2. The light path control member of claim 1, wherein the buffer layer is disposed between the first substrate and the first electrode, and wherein the first substrate, the first electrode, and the buffer layer satisfy a following condition:

refractive index of the buffer layer<refractive index of the first electrode<refractive index of the first substrate.

3. The light path control member of claim 1, wherein a thickness of the buffer layer is 300 nm to 3000 nm.

4. The light path control member of claim 2, wherein the refractive index of the buffer layer is 1.3 to 1.5.

5. The light path control member of claim 4, wherein the refractive index of the first substrate is 1.35 times or more the refractive index of the buffer layer.

6. The light path control member of claim 4, wherein the refractive index of the buffer layer is 0.8 times or more the refractive index of the first electrode.

7. The light path control member of claim 2, comprising:

a second buffer layer disposed between the second substrate and the second electrode, and wherein the second substrate, the second electrode, and the second buffer layer satisfy a following condition:

refractive index of the second buffer layer<refractive index of the second electrode<refractive index of the second substrate.

8. The light path control member of claim 1, wherein the buffer layer is disposed between the first electrode and the light conversion unit, and wherein the first substrate, the first electrode, and the buffer layer satisfy a following condition:

refractive index of the first electrode<refractive index of the buffer layer<refractive index of the first substrate.

9. The light path control member of claim 8, comprising:

a second buffer layer disposed between the second substrate and the second electrode, and wherein the second substrate, the second electrode, and the second buffer layer satisfy a following condition:

refractive index of the second buffer layer<refractive index of the second electrode<refractive index of the second substrate.

10. The light path control member of claim 8, comprising:

a second buffer layer disposed between the second electrode and the light conversion unit, and wherein the second substrate, the second electrode, and the second buffer layer satisfy a following condition:

refractive index of the second electrode<refractive index of the second buffer layer<refractive index of the second substrate.

11. The light path control member of claim 1, wherein the negative voltage is applied to the first electrode, and wherein the positive voltage is applied to the second electrode.

12. The light path control member of claim 11, wherein the first electrode includes a metal nanowire or mesh electrode.

13. The light path control member of claim 12, wherein the first electrode includes at least one metal selected from the group consisting of chromium (Cr), nickel (Ni), copper (Cu), aluminum (Al), silver (Ag), molybdenum (Mo), gold (Au), titanium (Ti), and alloys thereof; and wherein the second electrode includes indium tin oxide, indium zinc oxide, copper oxide, tin oxide, zinc oxide, or titanium oxide.

14. A display device comprising:

a panel comprising a display panel or a touch panel; and a light path control member disposed on or under the panel, wherein the light path control member comprises:

a first substrate;

a first electrode disposed on the first substrate;

a second substrate disposed on the first substrate;

a second electrode disposed under the second substrate;

a light conversion unit disposed between the first electrode and the second electrode and including a receiving part configured to receive a light conversion material; and a buffer layer disposed between the first substrate and the light conversion unit, wherein the first electrode and the second electrode include different materials, wherein a positive voltage and a negative voltage are applied to the first electrode and the second electrode, wherein an electrode to which the positive voltage is applied includes a metal oxide, and wherein an electrode to which the negative voltage is applied includes a metal material.

15. The display device of claim 14, wherein the negative voltage is applied to the first electrode, and wherein the positive voltage is applied to the second electrode.

16. The display device of claim 15, wherein the first electrode includes a metal nanowire or mesh electrode including at least one metal selected from the group consisting of chromium (Cr), nickel (Ni), copper (Cu), aluminum (Al), silver (Ag), molybdenum (Mo), gold (Au), titanium (Ti), and alloys thereof; and wherein the second electrode includes indium tin oxide, indium zinc oxide, copper oxide, tin oxide, zinc oxide, or titanium oxide.

17. The display device of claim 15, wherein the buffer layer is disposed between the first substrate and the first electrode, and wherein the first substrate, the first electrode, and the buffer layer satisfy a following condition:

refractive index of the buffer layer<refractive index of the first electrode<refractive index of the first substrate.

18. The display device of claim 17, wherein the light path control member includes a second buffer layer disposed between the second substrate and the second electrode, and wherein the second substrate, the second electrode, and the second buffer layer satisfy a following condition:

refractive index of the second buffer layer<refractive index of the second electrode<refractive index of the second substrate.

19. The display device of claim 16, wherein the panel includes a backlight unit and a liquid crystal display panel, wherein the light path control member is disposed between the backlight unit and the liquid crystal display panel, and wherein light emitted from the backlight unit moves in a direction from the first substrate toward the second substrate.

20. The display device of claim 16, wherein the panel includes an organic light-emitting diode panel, wherein the light path control member is disposed on the organic light-emitting diode panel, and wherein light emitted from the panel moves in a direction from the first substrate toward the second substrate.

* * * * *